United States Patent [19]

Yano et al.

[11] Patent Number: 5,721,173

[45] Date of Patent: Feb. 24, 1998

[54] METHOD OF FORMING A SHALLOW TRENCH ISOLATION STRUCTURE

[75] Inventors: Hiroyuki Yano; Katsuya Okumura, both of Yokohama, Japan

[73] Assignee: Kabushiki Kaisha Toshiba, Kawasaki, Japan

[21] Appl. No.: 805,314

[22] Filed: Feb. 25, 1997

[51] Int. Cl.$^6$ ................................................ H01L 21/76
[52] U.S. Cl. ........................ 438/424; 438/221; 438/296; 438/788; 438/759
[58] Field of Search ........................ 437/67, 63, 64, 437/228 TR, 228 POL, 238; 148/DIG. 5

[56] References Cited

U.S. PATENT DOCUMENTS

| | | | |
|---|---|---|---|
| 4,833,094 | 5/1989 | Kenney | 437/47 |
| 4,836,885 | 6/1989 | Breiten et al. | 156/643 |
| 5,173,439 | 12/1992 | Dash et al. | 437/67 |
| 5,182,221 | 1/1993 | Sato et al. | 437/67 |
| 5,196,368 | 3/1993 | Thompson et al. | 437/90 |
| 5,242,853 | 9/1993 | Sato et al. | 437/67 |
| 5,356,828 | 10/1994 | Swan et al. | 437/67 |
| 5,382,541 | 1/1995 | Bajor et al. | 437/67 |
| 5,455,189 | 10/1995 | Grubisich | 437/34 |
| 5,498,565 | 3/1996 | Gocho et al. | 437/67 |
| 5,504,033 | 4/1996 | Bajor et al. | 437/67 |
| 5,516,625 | 5/1996 | McNamara et al. | 430/314 |

OTHER PUBLICATIONS

Nesbit et al., "A 0.6μm$_2$ 256 Mb Trench DRAM Cell With Self–Aligned BuriEd STrap (BEST)", IEDM 1993, pp. 627–630.

*Primary Examiner*—Trung Dang
*Attorney, Agent, or Firm*—Banner & Witcoff, Ltd.

[57] ABSTRACT

A method of forming a trench isolation structure is provided in which a film is formed on a semiconductor substrate and a trench is formed in the semiconductor substrate through the film. A dielectric material is deposited in the trench and on the film. An etch resistant film is formed on the portions of the dielectric material in the trench and on exposed portions of the film at edge regions of the trench. The dielectric material on the film is selectively removed and the etch resistant film remaining on the dielectric material in the trench is selectively removed.

26 Claims, 4 Drawing Sheets

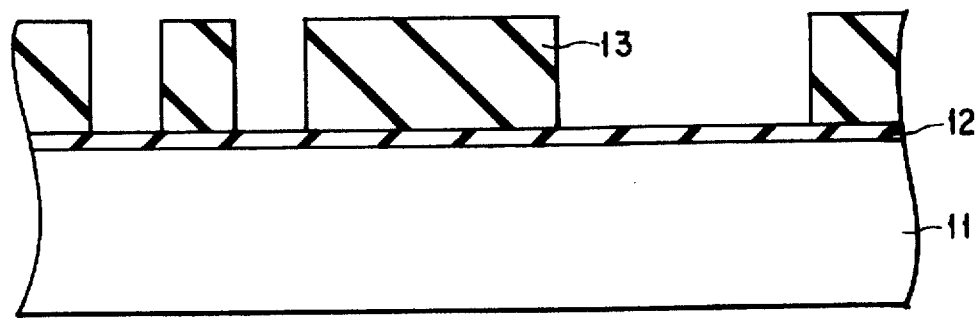
F I G. 1
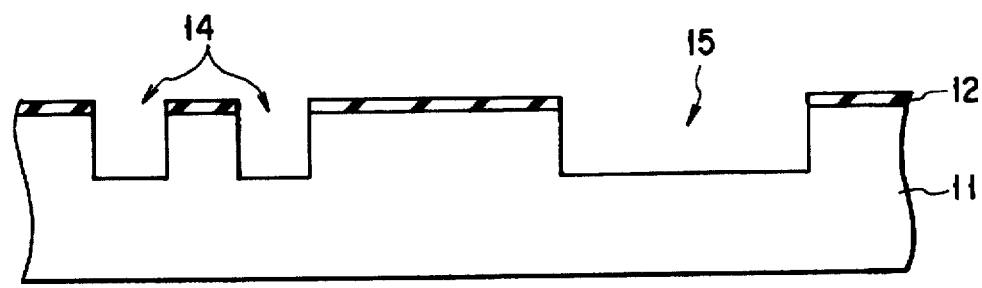
F I G. 2
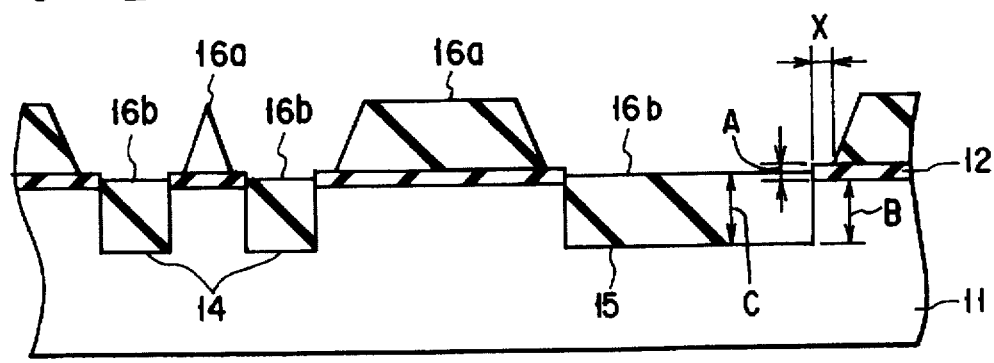
F I G. 3
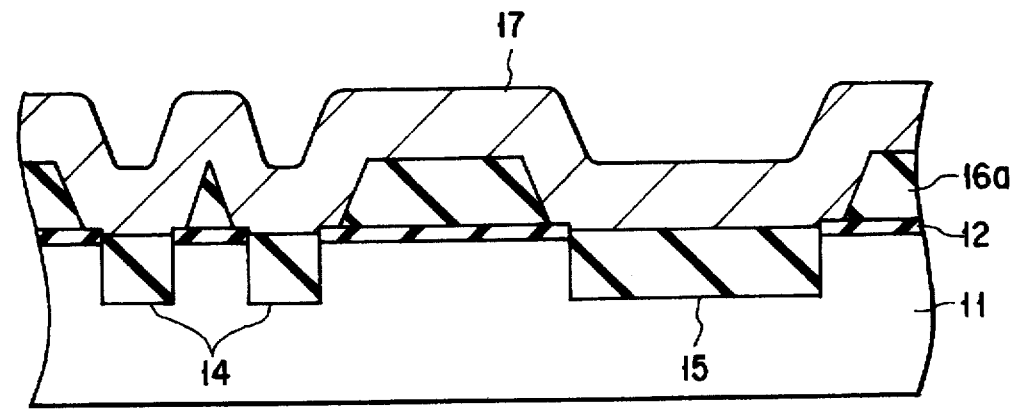
F I G. 4

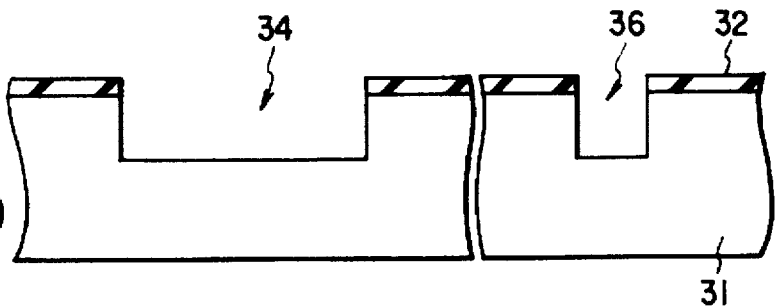
FIG. 10
PRIOR ART
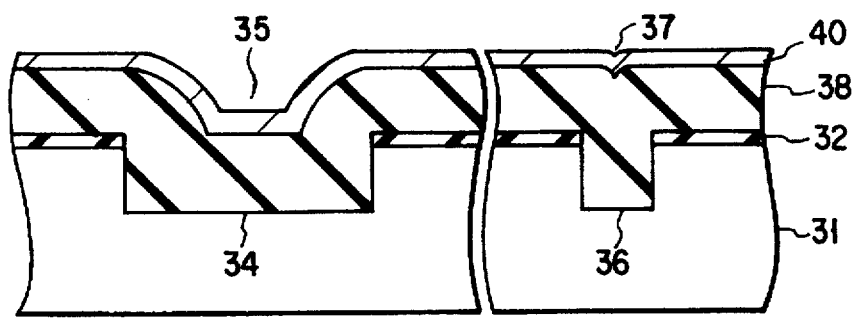
FIG. 11
PRIOR ART
FIG. 12
PRIOR ART
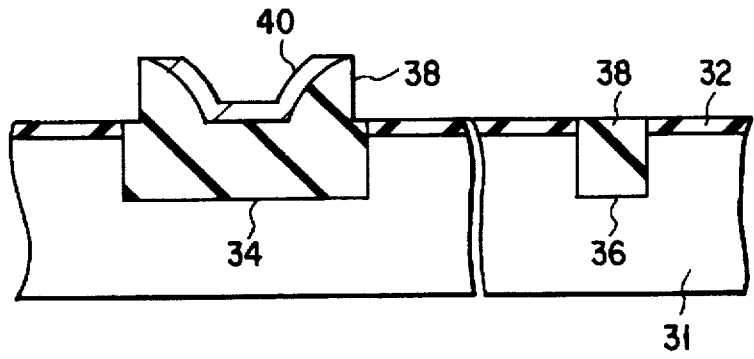
FIG. 13
PRIOR ART
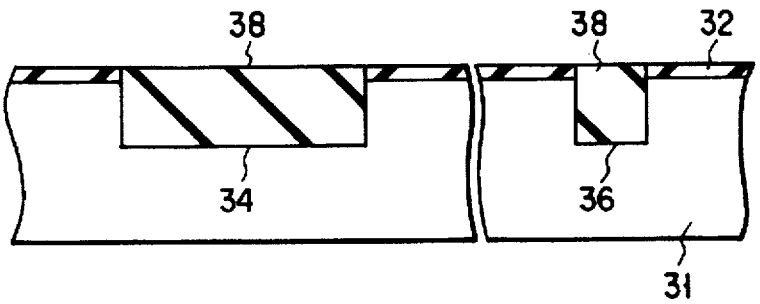
FIG. 14
PRIOR ART

METHOD OF FORMING A SHALLOW TRENCH ISOLATION STRUCTURE

BACKGROUND OF THE INVENTION

The present invention generally relates to a method of manufacturing a semiconductor device and, more particularly, to a method of forming a shallow trench isolation (STI) structure for isolating circuits of the semiconductor device.

Semiconductor devices generally include various discrete circuit elements formed on a semiconductor substrate of silicon, for example. These circuit elements are interconnected using various wiring layers for communicating signals to the circuit elements, from the circuit elements and/or between the circuit elements. The circuit elements themselves are generally isolated from one another. One way of achieving such isolation is by forming so-called field oxide regions on the semiconductor substrate using local oxidation of silicon (LOCOS). As semiconductor devices have become more highly integrated, isolation has been achieved using shallow trenches formed in the semiconductor substrate which are filled with an insulating material. This technique is generally known as the STI scheme. For highly integrated semiconductor devices such as 256 megabit (Mbit) dynamic random access memories (DRAMs) and beyond, STI offers the advantage of smaller element areas and better planarity. The better planarity improves the focus margin for lithography processes for layers formed on the semiconductor substrate and thereby enhances the ability to form highly integrated semiconductor devices.

Semiconductor devices often include circuit elements of different sizes. For example, DRAM devices generally include an array region having relatively small memory cells and a peripheral circuit region including larger circuit elements arranged to form circuits such as decoder circuits. An arrangement of a DRAM device including a peripheral circuit region 1 and a memory cell array region 2 is shown in FIG. 15. Memory cell array region 2 includes memory cells formed at the intersection of bit lines and word lines. For convenience, only memory cell 3 formed at the intersection of word line WL and bit line BL is shown. The peripheral circuit region 1 includes various peripheral circuit elements including elements for selecting memory cells. For example, peripheral circuit region 1 includes a p-channel field effect transistor (FET) 4 and an n-channel FET 5. The gates of FETs 4 and 5 are connected to selection circuitry 6. A first terminal of each of the FETs is connected to word line WL. A second terminal of FET 4 receives a word line drive signal WDRV and a second terminal of FET 5 is coupled to ground.

When using STI, it is desirable that the width of the trenches be varied in accordance with the sizes of the circuit elements being isolated. For example, relatively large circuit elements are preferably isolated using wider trenches than the trenches used for isolating smaller circuit elements. In order to form trenches having different sizes, various methods are available. U.S. Pat. No. 5,173,439 discloses one method of forming such trenches. FIGS. 9 to 14 show the method disclosed in the 439 patent. As shown in FIG. 9, a silicon nitride ($Si_3N_4$) film 32 is deposited on a semiconductor substrate 31 by chemical vapor deposition (CVD). Then, as shown in FIG. 10, trenches 34 and 36 having different sizes are formed using reactive ion etching (RIE). Thereafter, as shown in FIG. 11, a silicon dioxide ($SiO_2$) film 38 and a polysilicon film 40 are sequentially deposited on the entire surface of the resultant structure. Due to the presence of trenches 34 and 36, topographies 35 and 37 are formed in the upper surface of silicon dioxide film 38. Polysilicon layer 40 conforms to these topographies. Subsequently, a chemical mechanical polishing (CMP) operation is performed to remove the polysilicon layer 40 formed on the upper surface of silicon dioxide film 38 outside the topography 35. Since the topography 37 is small, the portion of polysilicon film 40 located in topography 37 is removed during the CMP process. Next, the silicon dioxide film 38 is etched by RIE using the polysilicon film 40 remaining above the trench 34 as a mask. As a result, as shown in FIG. 13, the trench 36 is filled up with the silicon dioxide film 38. Then, portions of the polysilicon film 40 and silicon dioxide film 38 remaining above the trench 34 are removed using CMP. Therefore, as shown in FIG. 14, the silicon dioxide film 38 in the trenches 34 and 36 is planarized together with the silicon nitride film 32, thus realizing STI.

The above manufacturing method, however, suffers from the following problem. More specifically, in the CMP step corresponding to FIG. 14, the silicon dioxide film 38 is polished together with the silicon nitride film 32. Hence, the thicknesses of the silicon nitride film 32 and silicon dioxide film 38 change. In other words, the level of the silicon dioxide film 38 with respect to the surface of the semiconductor substrate 31 depends on the thickness of the silicon nitride film 32. When the thickness of the silicon nitride film 32 changes due to CMP, it becomes difficult to precisely control the thickness of the silicon dioxide film 38.

The level of the silicon oxide film 38 with respect to the surface of the semiconductor substrate 31 is significant when forming an element such as a transistor in subsequent manufacturing steps. More specifically, when forming an element such as a transistor, the natural oxide film on the semiconductor substrate is removed first. In this step, the silicon dioxide film constituting the STI is etched together with the natural oxide film. The etch rate of the natural oxide is, for example, 200 Å/minute and a solution of $NH_4F$ and HF may be used as the etching solution. The etch rate of the natural oxide film is usually set to be constant on the entire wafer for ease of manufacture. The etch rate and the etching process parameters are set so that the level of the surface of the silicon dioxide film after etching coincides with the level of the surface of the semiconductor substrate. For this reason, if the level of the silicon dioxide film 38 with respect to the surface of the semiconductor substrate 31 varies, the level of the surface of the silicon dioxide film 38 after etching the natural oxide film does not coincide with the level of the surface of the semiconductor substrate 31.

Furthermore, in the manufacturing method described above, two CMP steps and two RIE steps are required in order to planarize the silicon oxide film 38. Since these steps are costly, the above-described manufacturing process is expensive.

BRIEF SUMMARY OF THE INVENTION

It is an object of the present invention to provide a method of forming a trench isolation structure for a semiconductor device, in which the thickness or height of a material buried in a trench with respect to the surface of a substrate can be accurately controlled and which can enable cost reduction.

The present invention provides a method of forming a trench isolation structure in which a film is formed on a semiconductor substrate and a trench is formed in the semiconductor substrate through the film. A dielectric material is deposited in the trench and on the film. An etch resistant film is formed on the portions of the dielectric material in the trench and on exposed portions of the film at edge regions of the trench. The dielectric material on the film is selectively removed and then the etch resistant film remaining on the dielectric material in the trench is selectively removed.

According to the present invention, the height or thickness of the dielectric material buried in the trench does not depend on the thickness of the film formed on the semiconductor substrate. Accordingly, the height of the dielectric material can be controlled accurately.

Also, according to the present invention, a planarized dielectric material can be formed in the trench without requiring a plurality of CMP steps and RIE steps, and the cost of manufacturing can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 7 illustrate a manufacturing method in accordance with the present invention;

FIGS. 9 to 14 illustrate a conventional manufacturing method; and

DETAILED DESCRIPTION OF THE INVENTION

Figure 5:
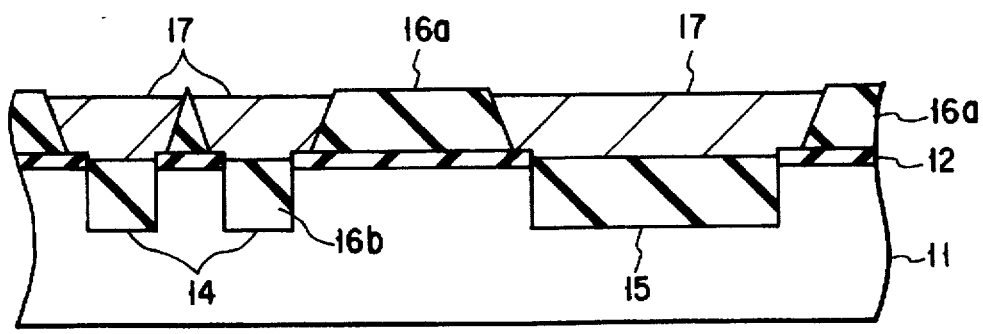

A preferred embodiment of the present invention will be described with reference to the accompanying drawings.

FIGS. 1 to 8 show an embodiment of the present invention.

As shown in FIG. 1, a silicon nitride ($Si_3N_4$) film 12 is deposited on a semiconductor substrate 11 by low pressure CVD (LPCVD). Substrate 11 may be a silicon wafer or an epitaxial layer formed on silicon or other materials. The thickness of the silicon nitride film 12 is, for example, 1,000 Å to 1,500 Å. A photoresist is formed on silicon nitride film 12 and is then patterned to form a resist pattern 13. The silicon nitride film 12 and the semiconductor substrate 11 are etched by RIE using the resist pattern 13 as a mask, thus forming a plurality of trenches 14 and 15 in the semiconductor substrate 11 as shown in FIG. 2. The width of each trench 14 is smaller than the width of each trench 15. By way of example, but not limitation, the width of trench 14 may be 0.5 micrometers ($\mu m$) and the width of trench 15 may be 20 micrometers ($\mu m$). Thereafter, the resist pattern 13 is removed.

Subsequently, as shown in FIG. 3, a silicon dioxide ($SiO_2$) film 16 is deposited in the trenches 14 and 15 and on silicon nitride film 12. Deposition of the silicon dioxide 16 can be performed using, for example, known bias sputtering, ECR (Electron Cyclotron Resonance)-plasma CVD, HDP (High Density Plasma).CVD, or ordinary CVD and etching. To decrease the number of steps, bias sputtering, ECR-plasma CVD, or HDP-CVD may be advantageously employed. In one implementation, an HDP.CVD tool available from Applied Materials Inc. of Santa Clara, Calif. was used. The power supplied for deposition was 3 kW, the substrate bias contributing to etching was 2.0 kW, the flow rate of silane was 30 sccm, the flow rate of oxygen was 60 sccm, the flow rate of argon was 40 sccm, the vacuum pressure in the chamber was $5 \times 10^{-3}$ Torr, and the film deposition speed on the flat portion (i.e., where no pattern is formed) was set at 2,300 Å/min. It will be appreciated that these tool settings are for purposes of illustration only and the present invention is not limited in this respect.

As a result of the deposition, silicon dioxide 16b is buried in the trenches 14 and 15, and silicon dioxide 16a is deposited on the silicon nitride film 12. With reference to FIG. 3, A, B, C, and x are, respectively, the thickness of the silicon nitride film 12; the depth of each of the trenches 14 and 15; the thickness of the silicon dioxide 16b in the trench; and the width of the silicon nitride film 12 exposed between the edge of each of the trenches 14 and 15 and the side surface of the silicon dioxide 16. These quantities preferably satisfy the following relationships:

$$x>0 \text{ and } A+B>C>B \tag{1}$$

The above relationships are preferable conditions for etching the silicon dioxide 16a in a step to be described later. By way of example, but not limitation, the thickness A of the silicon nitride film 12 may be 1,200 Å, the depth B of each of the trenches 14 and 15 may be 3,000Å, and the thickness C of the silicon dioxide 16b may be about 3,600 Å.

As shown in FIG. 4, a polysilicon film 17 is then deposited on the entire surface by LPCVD. The thickness of the polysilicon film 17 is, for example, about 4,000 Å.

Thereafter, the polysilicon film 17 is planarized by CMP using a slurry containing, for example, silica and amine, as major components. The selectivity between the polysilicon film 17 and silicon dioxide 16a is set, for example, at 200. As a result of this CMP, the surface level of the silicon dioxide 16a remaining on the silicon nitride film 12 and the surface level of the polysilicon film 17 substantially coincide with each other, as shown in FIG. 5. Furthermore, the silicon dioxide 16b in the trenches 14 and 15 and the silicon dioxide 16a on the silicon nitride film 12 are separated or isolated from each other by the polysilicon film 17 located on the silicon nitride film 12.

Figure 6:
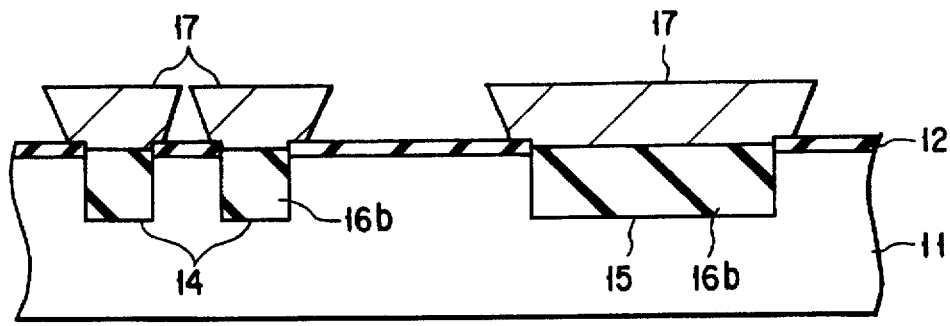

Subsequently, the silicon dioxide 16a on the silicon nitride film 12 is removed by wet etching using a dilute hydrogen fluoride solution (HF). FIG. 6 shows a state wherein the silicon dioxide 16a is removed. Since the silicon dioxide 16b in the trenches 14 and 15 is covered with the polysilicon film 17, it will not be etched.

Figure 7:
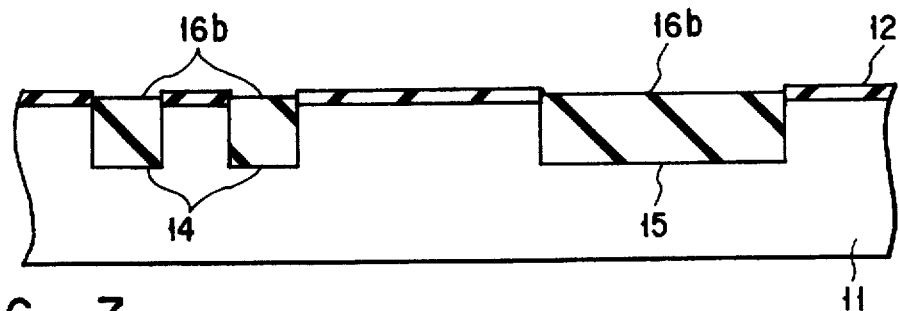

Thereafter, the polysilicon film 17 is removed by chemical dry etching (CDE) using $CF_4$ and oxygen and setting the selectivity between the polysilicon film 17 and silicon dioxide 16b at about 20. As a result, as shown in FIG. 7, the polysilicon film 17 on the silicon dioxide 16b is removed. At this time, the silicon dioxide 16b is etched only slightly.

Subsequently, the silicon nitride film 12 on the semiconductor substrate 11 is removed by using a heated phosphoric acid solution and setting the selectivity between the silicon nitride film 12 and silicon dioxide 16b at infinity.

According to this embodiment, when depositing silicon dioxide 16b in the trenches 14 and 15, the thickness or height C of the silicon dioxide 16b in the trenches 14 and 15 is set to be larger than the depth B of the trenches 14 and 15 and smaller than the height (A+B) of the surface of the silicon nitride film 12. More specifically, in this embodiment, the final thickness of the silicon dioxide 16b is defined by the depth B of the trenches 14 and 15 and the height C of the silicon dioxide 16b deposited in the trenches 14 and 15. Since the thickness of the silicon dioxide 16b does not depend on the thickness of the silicon nitride film 12 formed on the semiconductor substrate 11, the thickness can be controlled accurately.

In addition, when depositing silicon dioxide 16b in the trenches 14 and 15, the width x of the silicon nitride film 12 exposed between the edge of each of the trenches 14 and 15 and the side surface of the silicon dioxide 16a can be preset. Hence, the silicon dioxide 16b in the trenches 14 and 15 and the silicon dioxide 16a on the silicon nitride film 12 can be reliably separated or isolated from each other by the polysilicon film 17. Therefore, the silicon dioxide 16a on the silicon nitride film 12 can be reliably removed by wet etching without etching the silicon dioxide 16b in the trenches 14 and 15.

Further, the shallow trench isolation structure can be formed using one CMP step, one RIE step and one wet etching step. Since the number of expensive processing steps is decreased, cost reduction can be realized.

In this embodiment, the final thickness or height of the silicon dioxide 16b does not depend on the thickness of the silicon nitride film 12. Therefore, for example, a trench capacitor for a DRAM may be formed before the formation of the trenches 14 and 15 and the trenches may be filled with a dielectric material having a predetermined thickness. In contrast, in the prior art technique, when a trench capacitor constituting a DRAM is formed before formation of the shallow trenches, the thickness of the silicon nitride film on the substrate changes undesirably. Thus, when shallow trenches are formed after this, it is difficult to bury the trenches with a dielectric material having a predetermined thickness.

When an oxide in a large trench is polished by CMP in the final step, the thickness of the oxide can sometimes differ between the central portion and peripheral portion of the trench. However, in this embodiment, CMP is not employed in the final step of filling the trench with the silicon dioxide. Accordingly, the thickness of the silicon dioxide buried in the trench can be maintained at a uniform value.

The present invention is not limited to the above embodiment. For example, in the above embodiment, the polysilicon film 17 is deposited on the silicon dioxide 16b buried in the trenches 14 and 15. However, a silicon nitride film may be used in place of the polysilicon film 17. With this arrangement, when removing the silicon nitride film on the silicon dioxide 16b buried in the trenches 14 and 15, the silicon nitride film 12 on the substrate 11 can be removed simultaneously. Therefore, the number of processing steps can be decreased.

Figure 8:
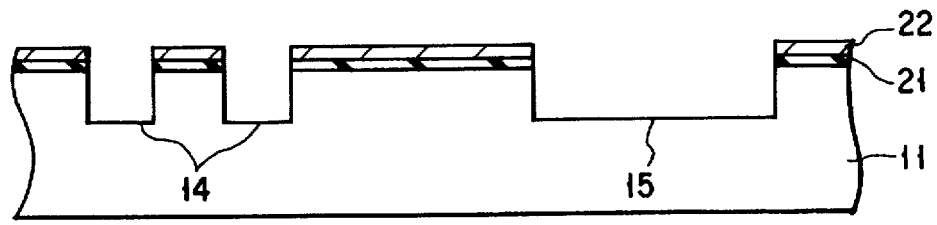
FIG. 8 is a sectional view showing a modification of the method of the present invention.
Figure 9:
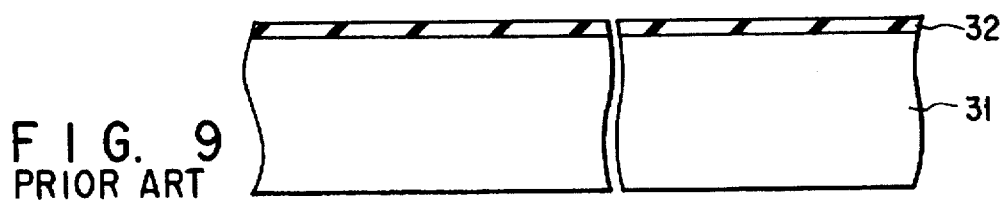
Figure 15:
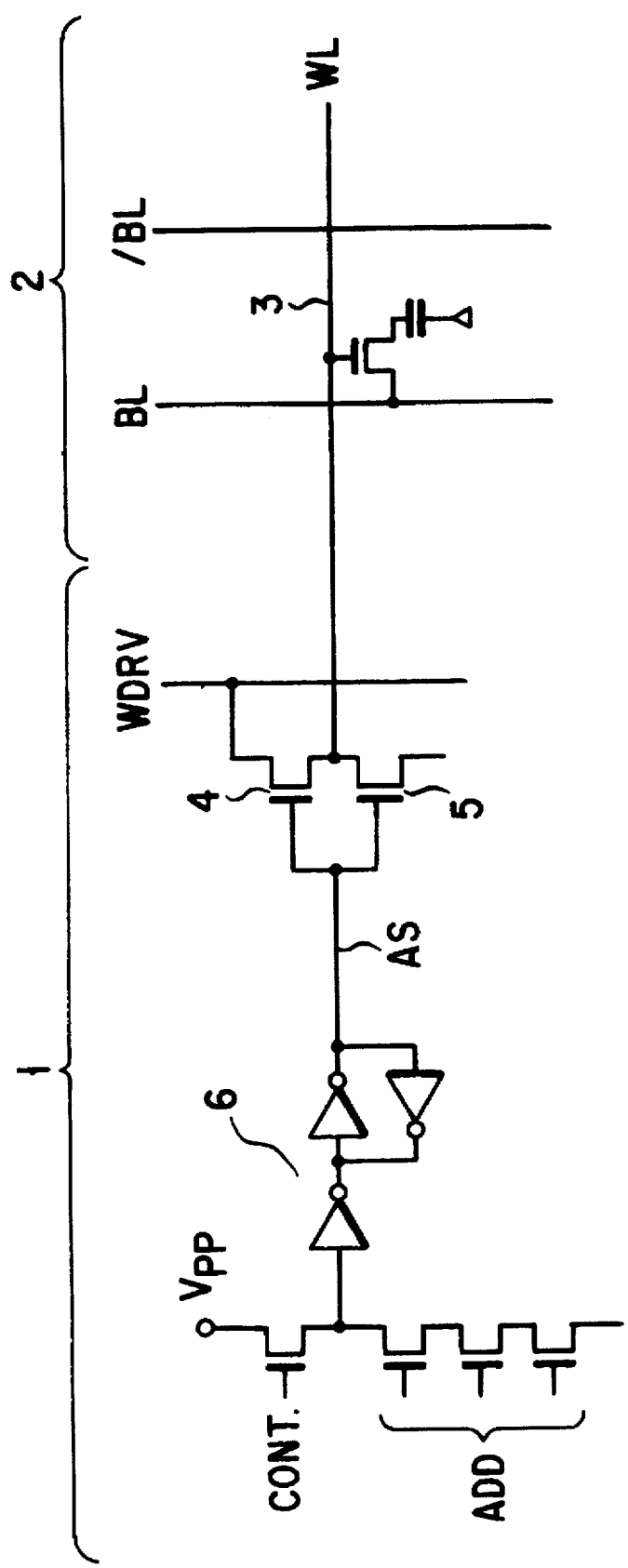
FIG. 15 illustrates circuitry associated with a conventional DRAM.

In the above embodiment, a silicon nitride film 12 is formed on the surface of the semiconductor substrate 11. However, a polysilicon film may be used in place of the silicon nitride film. In this case, as shown in FIG. 8, a silicon dioxide film 21 is first formed on semiconductor substrate 11, and then a polysilicon film 22 is formed on the silicon dioxide film 21. With this arrangement, when the polysilicon film 17 on silicon dioxide 16b buried in trenches 14 and 15 is removed, the polysilicon film 22 on the semiconductor substrate 11 can be removed simultaneously. Therefore, the number of processing steps can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of forming a trench isolation structure, comprising the steps of:

forming a film on a semiconductor substrate;

forming a trench in said semiconductor substrate through said film;

depositing a dielectric material in said trench and on said film;

forming an etch resistant film on an entire surface of said substrate by LPCVDLTC:

removing said etch resistant film so as to remain on the portions of said dielectric material in said trench and on exposed portions of said film at edge regions of said trench;

selectively removing said dielectric material on said film; and selectively removing said etch resistant film remaining on said dielectric material in said trench.

2. A method according to claim 1, wherein $$x>0, A+B>C>B,$$

where A is the thickness of said film, B is the depth of said trench, C is the thickness of said dielectric material in said trench, and x is the distance between an edge of said trench and a side surface of said dielectric material on said film.

3. A method according to claim 1, wherein said dielectric material is formed by using one method selected from the group consisting of bias sputtering, ECR.plasma CVD, and HDP CVD.

4. A method according to claim 1, wherein said dielectric material is formed by using CVD and etching.

5. A method according to claim 1, wherein said etch resistant film is removed by chemical mechanical polishing until an upper surface of said etch resistant film is substantially level with an upper surface of said dielectric material.

6. A method according to claim 1, wherein said film is a silicon nitride film.

7. A method according to claim 5, wherein said etch resistant film is a polysilicon film.

8. A method according to claim 5, wherein said dielectric material is a silicon dioxide film.

9. A method according to claim 1, wherein said film comprises a polysilicon film formed on a silicon dioxide film, and said dielectric material is a silicon dioxide film.

10. A method according to claim 5, wherein said film and said etch resistant film are silicon nitride films.

11. A method of forming a trench isolation structure, comprising the steps of:

forming a film on a semiconductor substrate;

forming a trench in said semiconductor substrate through said film;

depositing a dielectric material in said trench and on said film, said dielectric material in said trench having a height which is larger than a depth of said trench and smaller than a height of a surface of said film;

forming an etch resistant film by LPCVD on an entire surface of said semiconductor substrate;

removing said etch resistant film until an upper surface of said etch resistant film is substantially level with an upper surface of said dielectric material, said etch resistant film remaining on said dielectric material in said trench and on portions of said film located at an edge region of said trench;

selectively removing said dielectric material on said film; and selectively removing said etch resistant film remaining on said dielectric material in said trench.

12. A method according to claim 1, wherein $$x>0, A+B>C>B,$$

where A is the thickness of said film, B is the depth of said trench, C is the thickness of said dielectric material in said trench, and x is the distance between an edge of said trench and a side surface of said dielectric material on said film.

13. A method according to claim 11, wherein said dielectric material is formed by using one method selected from the group consisting of bias sputtering, ECR.plasma CVD, and HDP.CVD.

14. A method according to claim 11, wherein said dielectric material is formed by using CVD and etching.

15. A method according to claim 11, wherein said dielectric material is selectively removed by wet etching using hydrogen fluoride.

16. A method according to claim 11, wherein said film is a silicon nitride film.

17. A method according to claim 11, wherein said etch resistant film is a polysilicon film.

18. A method according to claim 11, wherein said dielectric material is a silicon dioxide film.

19. A method according to claim 11, wherein said film comprises a polysilicon film formed on a silicon dioxide film, and said dielectric material is a silicon dioxide film.

20. A method according to claim 11, wherein said film and said etch resistant film are silicon nitride films.

21. A method of forming a trench isolation structure, comprising the steps of:

forming a silicon nitride film on a semiconductor substrate;

forming a trench in said semiconductor substrate through said silicon nitride film;

depositing silicon dioxide in said trench and on said silicon nitride film, said silicon dioxide in said trench having a height which is greater than a depth of said trench and less than a height of a surface of said silicon nitride film, wherein said silicon nitride film is disposed between the portions of said silicon dioxide deposited in said trench and the portions of said silicon dioxide deposited on said silicon nitride film;

forming a polysilicon film on an entire surface of said semiconductor substrate;

removing said polysilicon film until an upper surface of said polysilicon film is substantially level with an upper surface of said silicon dioxide, said polysilicon film remaining on the portions of said silicon dioxide in said trench and on portions of said silicon nitride film located at an edge region of said trench;

selectively removing the portions of said silicon dioxide on said silicon nitride film; and selectively removing said polysilicon film remaining on the portions of said silicon dioxide in said trench.

22. A method according to claim 21, wherein $$x>0, A+B>C>B,$$

where A is the thickness of said film, B is the depth of said trench, C is the thickness of said dielectric material in said trench, and x is the distance between an edge of said trench and a side surface of said dielectric material on said film.

23. A method according to claim 21, wherein said silicon dioxide is formed by using one method selected from the group consisting of bias sputtering, ECR.plasma CVD, and HDP.CVD.

24. A method according to claim 21, wherein said silicon dioxide is formed by using CVD and etching.

25. A method according to claim 21, wherein said polysilicon film is formed by LPCVD.

26. A method according to claim 21, wherein the silicon dioxide is selectively removed by wet etching using hydrogen fluoride.

* * * * *